(12) United States Patent
Wesson et al.

(10) Patent No.: US 11,767,927 B2
(45) Date of Patent: Sep. 26, 2023

(54) SMART SOLENOID VALVE

(71) Applicants: TE CONNECTIVITY SERVICES GMBH, Schaffhausen (CH); TYCO ELECTRONICS (SHANGHAI) CO. LTD., Shanghai (CN)

(72) Inventors: Robin Wesson, Middletown, PA (US); Pai Rajendra, Shanghai (CN); Tian Xia, Shanghai (CN); Tracy Chen, Shanghai (CN)

(73) Assignees: TE CONNECTIVITY SOLUTIONS GMBH, Schaffhausen (CH); TYCO ELECTRONICS (SHANGHAI) CO. LTD., Shanghai (CN)

(*) Notice: Subject to any disclaimer, the term of this patent is extended or adjusted under 35 U.S.C. 154(b) by 100 days.

(21) Appl. No.: 17/369,042

(22) Filed: Jul. 7, 2021

(65) Prior Publication Data
US 2023/0008825 A1   Jan. 12, 2023

(51) Int. Cl.
F16K 31/06 (2006.01)
F16K 37/00 (2006.01)
H05K 1/18 (2006.01)

(52) U.S. Cl.
CPC ...... *F16K 31/0675* (2013.01); *F16K 31/0658* (2013.01); *F16K 37/0041* (2013.01); *H05K 1/181* (2013.01)

(58) Field of Classification Search
CPC .. F16K 31/0675; F16K 31/0658; H05K 1/181
See application file for complete search history.

(56) References Cited

U.S. PATENT DOCUMENTS

| | | | |
|---|---|---|---|
| 6,579,563 B1 * | 6/2003 | Dillon | G01F 11/32 118/712 |
| 8,840,084 B2 * | 9/2014 | Crist | G05D 7/0623 239/69 |
| 9,631,432 B2 * | 4/2017 | Downton | E21B 34/066 |
| 2018/0045196 A1 * | 2/2018 | Rampen | F16K 31/0655 |

* cited by examiner

*Primary Examiner* — Eric Keasel

(57) ABSTRACT

A solenoid valve having a solenoid body with a solenoid receiving cavity and a flow receiving passage. A solenoid assembly is provided in the solenoid receiving cavity. A valve is provided in the flow receiving passage. An armature extends from the solenoid to the valve. The solenoid valve also includes a control circuitry, a power connection and a bidirectional communications connection. At least one sensor is provided in the flow receiving passage. The at least one sensor is in communication with the control circuitry. When in operation, power is continuously supplied through the power connection and the actuation of the solenoid valve is initiated by the bidirectional communications connection.

5 Claims, 4 Drawing Sheets

SMART SOLENOID VALVE

FIELD OF THE INVENTION

The present invention is directed to a solenoid valve which has advanced monitoring and control capability. In particular, the invention is directed to a solenoid valve with integrated electronic functionality.

BACKGROUND OF THE INVENTION

It is known that a solenoid valve is essentially a valve that acts on the opening/closing, or choking, if necessary, of the fluid flow going through it, by means of an actuator, which, in the case of a solenoid valve, is of electromagnetic type. Generally, such actuator consists of a solenoid through which the running of a controlled current generates an electromagnetic field which attracts or repels some elements of polarized ferromagnetic materials, thus inducing the actuation of the solenoid valve on the flow to be opened/closed, or, if necessary, choked. Solenoid valves are traditionally one-way devices, wherein if power is applied the valve moves.

Solenoid valves may be used in various applications, including in home appliances and also in industrial applications. Valves can be critical to equipment operation for example to facilitate the safe operation of a home appliance or industrial process. Monitoring the proper operation of a valve can help to ensure proper operation of the appliance or system it is part of. However, valves in appliances and industrial processes are often very low cost and do not have independent monitoring capabilities. Consequently, the operation of the valves is controlled in an open loop manner by a network or control module which is configured to manage or control the appliance or process.

As shown in FIG. 1, as a known solenoid valve 2 requires several amps of current 3, a relay 4 must be provided to control the activation supply current 5 to the solenoid 6 as this current cannot be supplied through the control module electronics 7, thereby increasing the complexity and expense of the operation of the solenoid valve. In addition, the solenoid valve 2 is not able to monitor or detect failure modes, such as calcification which may affect more expensive components of the appliance or system. Therefore, the management system of the known solenoid valve is limited only to control passive system nodes, and may provide, at most, for a system for diagnosing the operating status of the solenoid valve itself.

It would, therefore, be desirable to provide a solenoid valve which overcomes the issues associated with the known art. In particular, it would be beneficial to provide a solenoid valve with integrated electronic functionality which has advanced monitoring and control capability.

SUMMARY OF THE INVENTION

It is an object to provide integrated electronic functionality within the solenoid valve to enable a smart relay that can interface directly with the controller module via a bidirectional communications bus or wireless link which enables additional advanced monitoring and control capability to be added to the solenoid valve.

An embodiment is directed to a solenoid valve having a solenoid body with a solenoid receiving cavity and a flow receiving passage. A solenoid assembly is provided in the solenoid receiving cavity. A valve is provided in the flow receiving passage. An armature extends from the solenoid to the valve. The solenoid valve also includes control circuitry, a power connection and a bidirectional communications connection. At least one sensor is provided in the flow receiving passage. The at least one sensor is in communication with the control circuitry. When in operation, power is continuously supplied through the power connection and actuation of the solenoid valve is initiated by the bidirectional communications connection.

An embodiment is directed to a solenoid valve having a solenoid body with a solenoid receiving cavity and a flow receiving passage. A solenoid assembly is provided in the solenoid receiving cavity. A valve is provided in the flow receiving passage. The valve is movable between an open position and a closed position. An armature extends from the solenoid to the valve. The armature is movable between a first position and a second position as the solenoid is engaged and disengaged. At least one sensor is provided in the solenoid body, the at least one sensor is in communication with the flow receiving passage. Control circuitry is provided in electrical engagement with the at least one sensor. The solenoid valve has a power connection and a low voltage communications connection. When in operation, power is continuously supplied through the power connection and the actuation of the solenoid valve is initiated and monitored by the low voltage communications connection. Data collected from the at least one sensor is communicated over the low voltage communications connection to a database which can be accessed remotely from the solenoid valve.

Other features and advantages of the present invention will be apparent from the following more detailed description of the illustrative embodiment, taken in conjunction with the accompanying drawings which illustrate, by way of example, the principles of the invention.

DETAILED DESCRIPTION OF THE INVENTION

Figure 1:
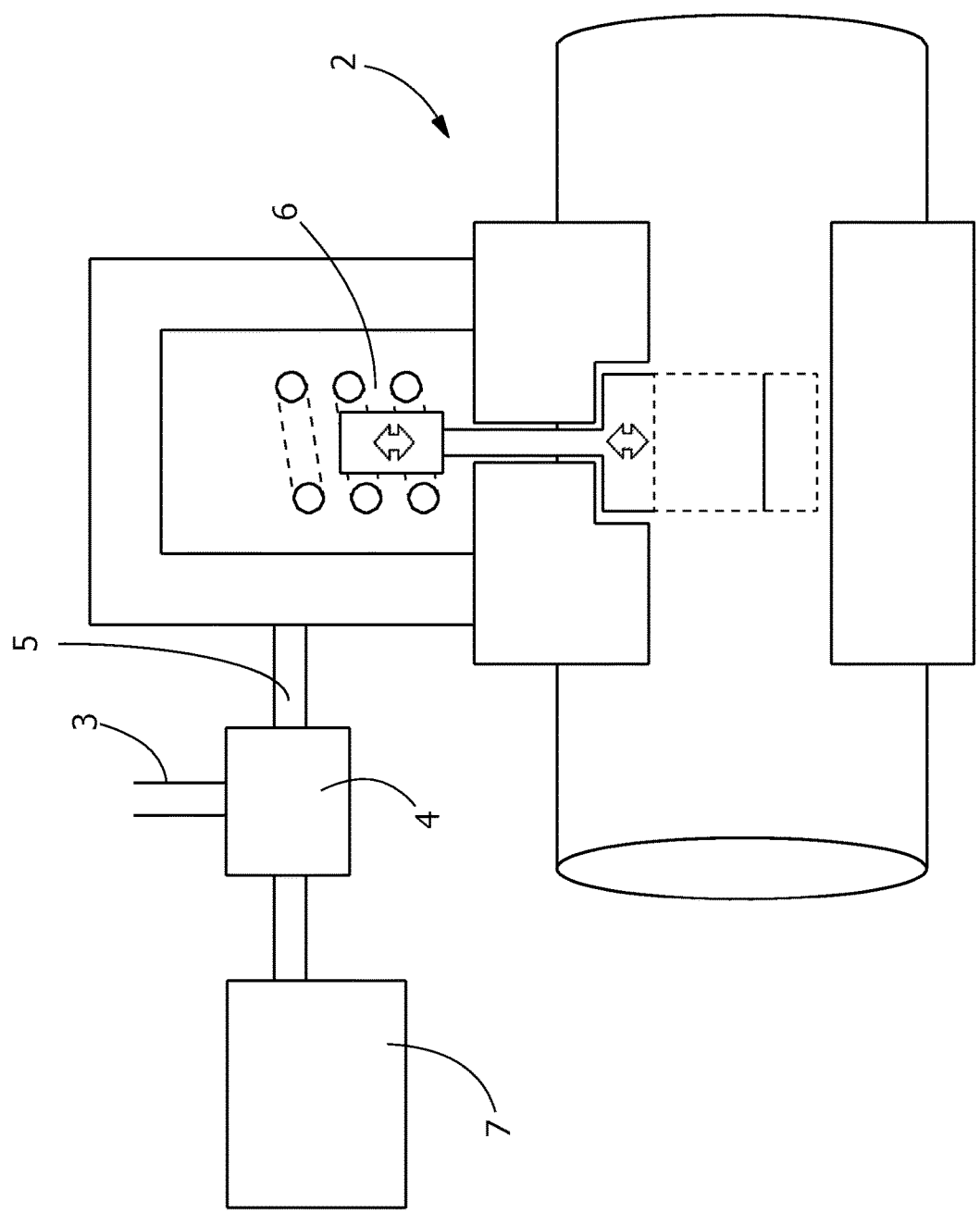
FIG. 1 is a diagrammatic view of a solenoid valve according to the prior art, illustrating the need for a relay.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise.

Moreover, the features and benefits of the invention are illustrated by reference to the preferred embodiments. Accordingly, the invention expressly should not be limited to such embodiments illustrating some possible non-limiting combination of features that may exist alone or in other combinations of features, the scope of the invention being defined by the claims appended hereto.

Figure 2:
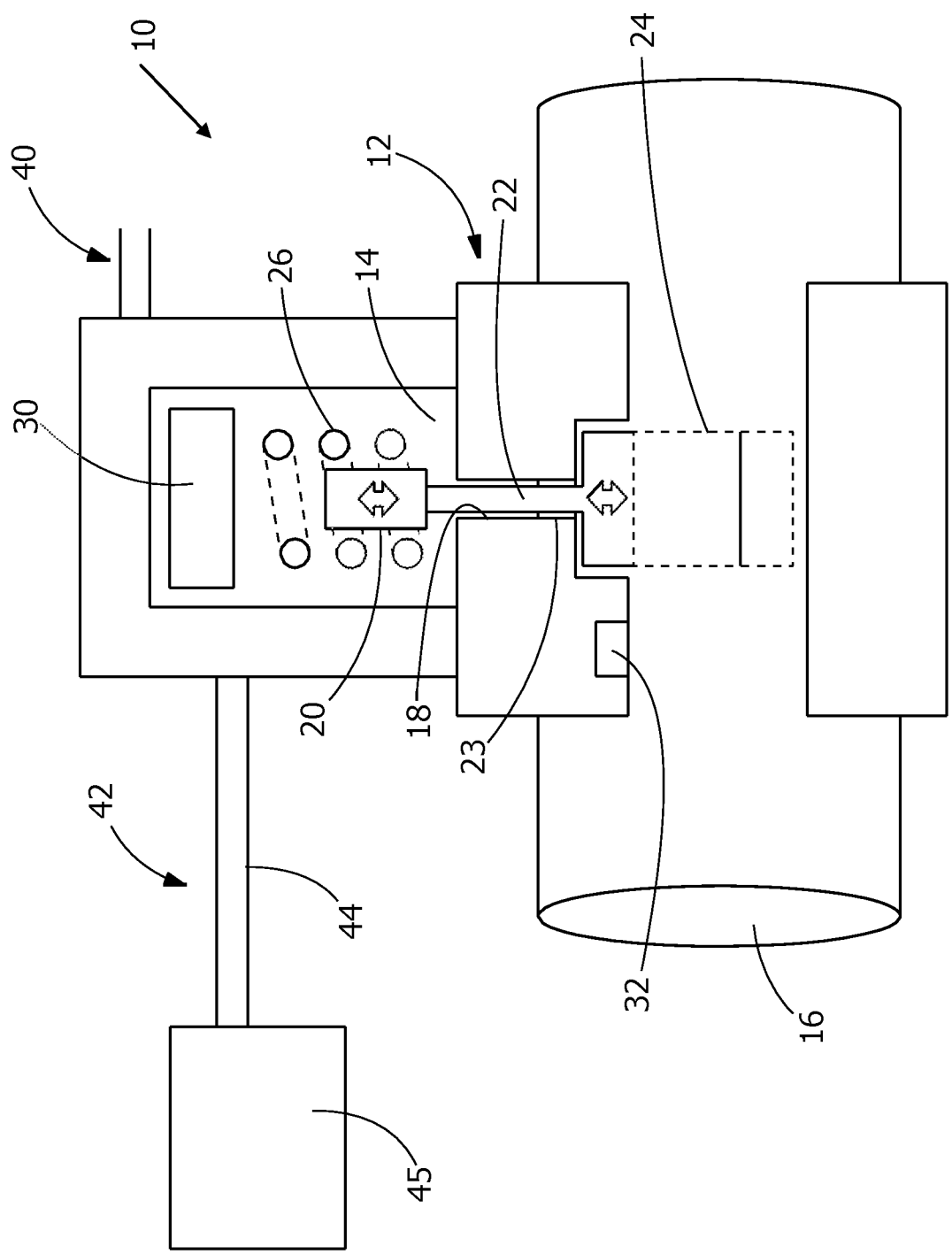
FIG. 2 is a diagrammatic view of an illustrative smart solenoid valve according to the present invention, illustrating the ability of the smart solenoid valve to interface directly with a control module via a wired bidirectional communications bus.

As shown in FIG. 2, an illustrative embodiment of a solenoid valve 10 according to the present invention is shown. The solenoid valve 10 includes a housing 12 with a solenoid receiving cavity 14 and a fluid receiving passage 16. An armature receiving opening 18 extends between the solenoid receiving cavity 14 and the fluid receiving passage 16.

A solenoid assembly 20 is provided in the solenoid receiving cavity 14. The solenoid 20 can be any type of solenoid known in the industry. As the operation of solenoid assembly 20 are well known, a detailed explanation of the operation of the solenoid will not be provided.

An armature 22 extends from the solenoid 20. The armature 22 is slidably positioned in the armature receiving opening 18. The armature 22 is movable between first position, in which an end of the armature 22 is positioned proximate the armature receiving opening 18, and a second position, in which the end of the armature extends away from the armature receiving opening 18 and into the fluid receiving passage 16. A seal 23 is provided in the armature receiving opening 18 to prevent fluid from entering the solenoid receiving cavity 14 from the fluid receiving passage 16.

An armature spring 26 is positioned in the solenoid receiving cavity 14. The armature spring 26 is configured to apply an armature spring force to the solenoid assembly 20 and the armature 22. As is known, the force provided by the armature spring 26 facilitates the movement of the armature 26.

A valve 24 is provided in the fluid receiving passage 16. The valve 24 is attached to the end of the armature 22 and is movable between an open position, which allows fluid to pass through the fluid receiving passage 16, and a closed position, in which the valve 24 blocks the fluid receiving passage 16, preventing the fluid from passing through the fluid receiving passage 16.

In the illustrative embodiment shown, control circuitry, such as a printed circuit board 30 is provided in the solenoid cavity 14. However, the printed circuit board 30 may be provided at other locations within the solenoid valve 10.

In the illustrative embodiment shown in FIG. 2, the solenoid valve has at least one sensor 32. In the illustrative embodiment shown, the sensor 32 is mounted in the solenoid body 12 and is in physical communication with the fluid receiving passage 16. The sensor 32 is positioned at an inflow side of the fluid receiving passage 16. However, other numbers and locations of sensors can be used without departing from the scope of the invention. The at least one sensor 32 is provided in electrical communication with the printed circuit board 30.

Figure 3:
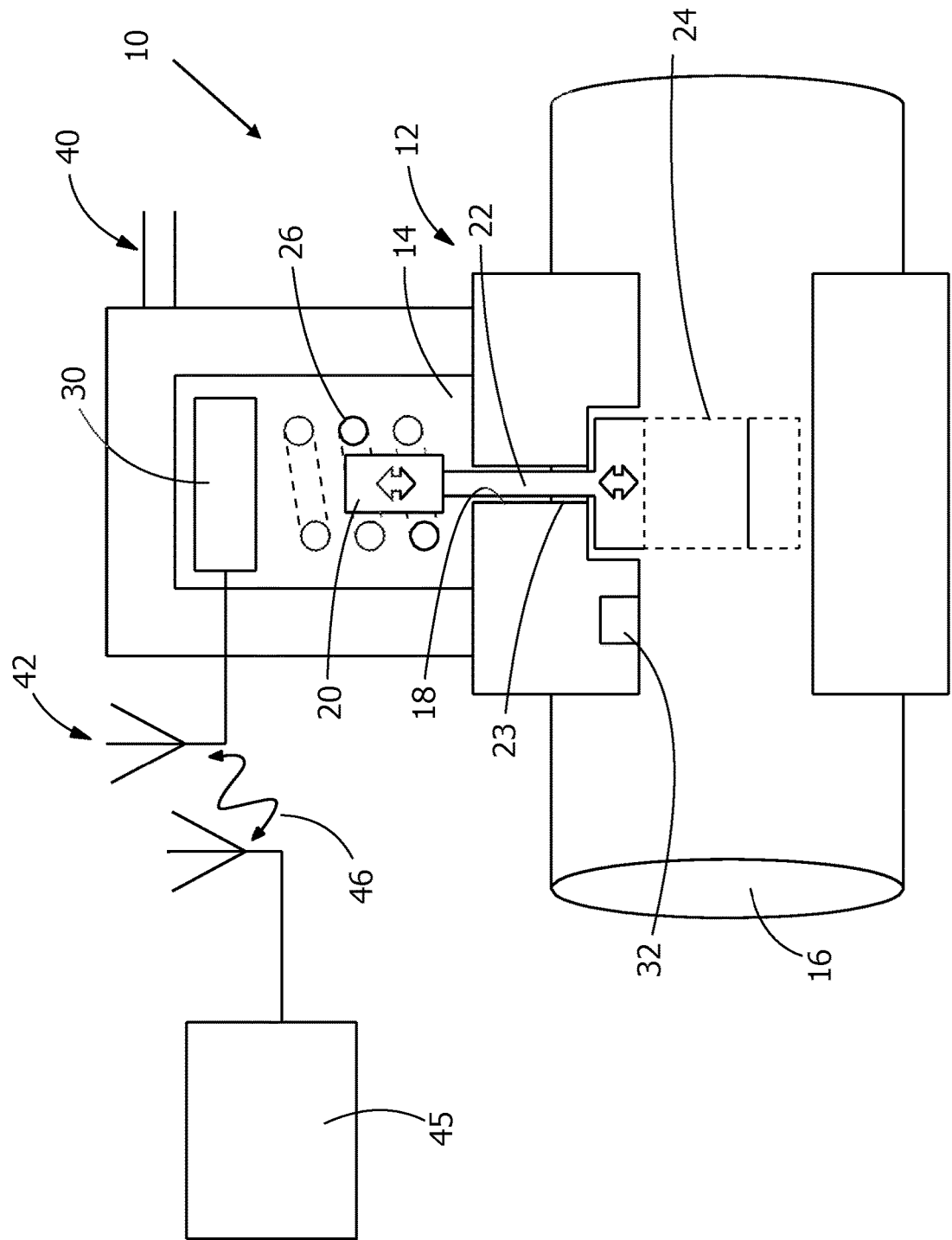
FIG. 3 is a diagrammatic view of an illustrative smart solenoid valve according to the present invention, illustrating the ability of the smart solenoid valve to interface directly with a control module via a wireless connection.
Figure 4:
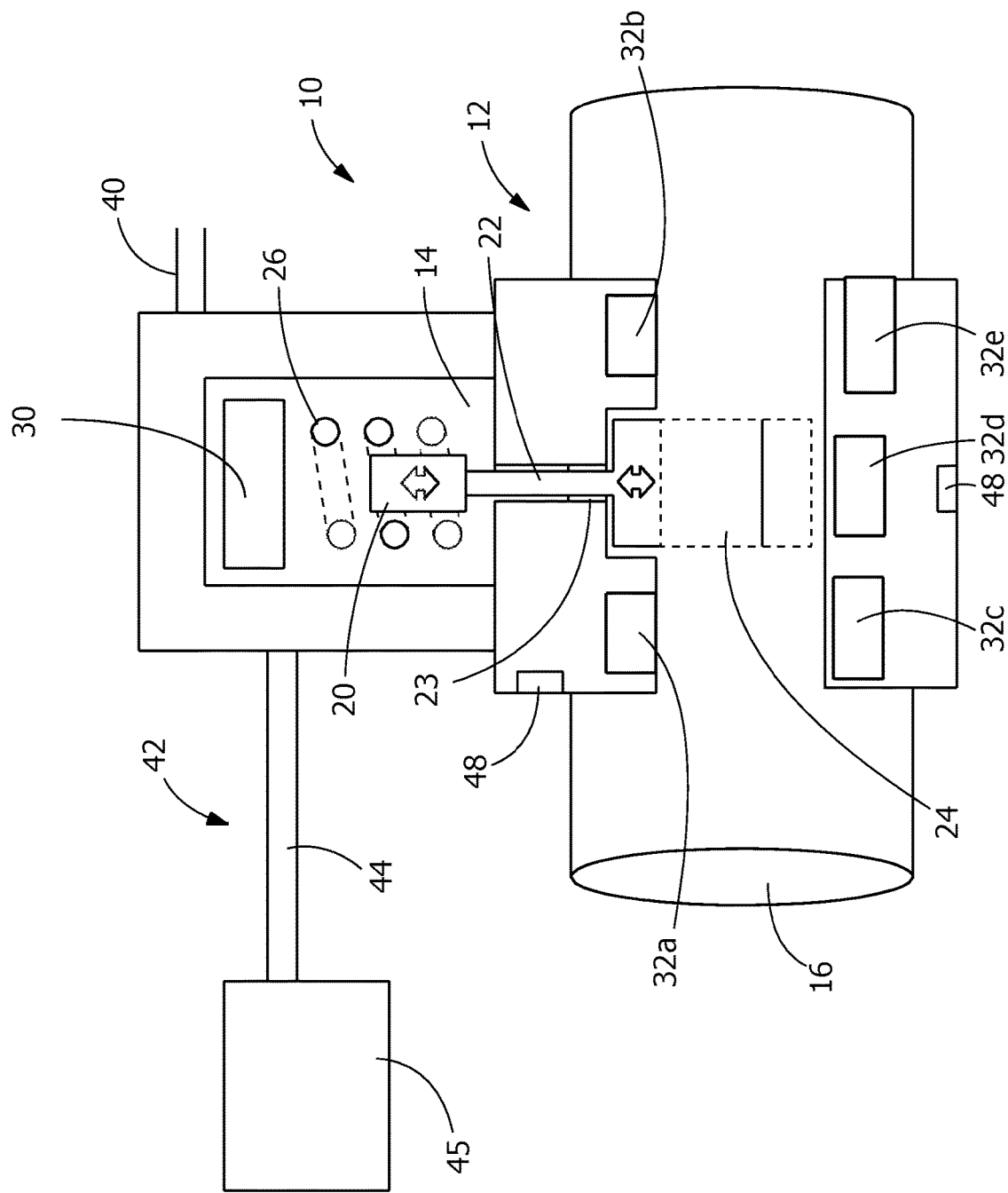
FIG. 4 is a diagrammatic view of a smart solenoid valve according to the present invention, showing illustrative sensors positioned a flow channel chamber of the smart solenoid valve.

The solenoid valve 10 includes a power connection 40 and a bidirectional communications link or connection 42. The bidirectional communications connection 42 with the control module 45 can be wired, as shown in FIG. 2, or wireless, as shown in FIG. 3. Unlike known solenoid valves 2 (such as shown in FIG. 1) in which the power connection 3 requires an actuator (relay) 4, as the voltage and current required are not compatible with the electronic control circuitry 7, the present invention, as shown in FIGS. 2 through 4, does not require the use of a relay. With the dual connection of the power connection 40 and the bidirectional communications connection 42 to the solenoid valve 10, power can be supplied all the time and the actuation can be initiated, and monitored, via a low voltage communication bus 44 (FIG. 2) or with wireless transmissions 46 (FIG. 3). Examples of low voltage communication busses 44 include, but are not limited to, I2C, SPI, CAN, Bespoke Appliance Bus. RF transceivers for wireless transmission 46, may use, but are not limited to, Zigbee, Bluetooth, Wi-Fi or Lora protocols.

The switching of the solenoid assembly 20 can be done by solid state means locally to the solenoid valve 10 instead of remotely. With respect to the power connection 40, a control messages and power can be supplied through the same power connection wiring 40, minimizing the wiring complexity of the installation.

In various embodiments, it may be advantageous for the solenoid valve 10 to provide power to the sensors 32 in a non contact manner such as inductively through the walls of a conduit or pipe which is attached to the solenoid valve or through the solenoid body 12. This avoids the necessity to pass wiring through the walls of the pipe or the fluid receiving passage 16. In other embodiments, inductive transmission and reception of both power and data can connect sensors 32 to circuitry outside the conduit or pipe or outside the solenoid body 12. In other embodiments, specific conductive points 48 (FIG. 4) may be provided on the pipe or solenoid body 12. The conductive points 48 are partially metallized or incorporate metallic or non-metallic conductive dopants to allow power and signal transmission to the sensors 32 without impacting the fluid retention effectiveness of the pipe or solenoid body 12.

The bidirectional communications link 42 enables sensors 32 to be integrated in the system, allowing the solenoid valve 10 to act actively sense conditions of the fluid receiving passage 16. As the condition of the fluid can impact the operation of the appliance or system, sensing the condition of the fluid at the solenoid valve 10 can prevent damage to the other components of the appliance or system. If the sensors 32 determine an improper condition of the fluid is present, the sensors 32 can close the solenoid valve 10 and stop the operation of the appliance or system. Additionally, data collected by the sensors 32 can be communicated over the bidirectional communications link 42 to a data base which is remote from the solenoid assembly 10. This allows the data to be accessed and analyzed from many different locations.

For example, the bidirectional communications link 42 allows the sensor valve 10 to act as a water quality inlet monitor or flow switch. When flow and pressure sensors are included, the flow of the fluid through the solenoid valve 10 can be limited if excess pressure is detected. This prevents the excess pressure from being transmitted downstream to other components.

As shown in FIG. 4, sensors 32a, 32b, 32c, 32d, 32e can be provided to monitor various conditions of the fluid or the sensor valve 10, including, but not limited to, inlet pressure (high or low pressure can impact appliance performance), inlet water quality (turbidity), inlet water temperature (in association with other parameters can enable appliance heating efficiency calculations, for example in a hot water boiler appliance), valve position (allowing the valve to be set to half-open in cases of excess water pressure, or to monitor the valve for signs of calcification that may require early valve replacement), water flow rate (to monitor water usage), solenoid actuator impedance, solenoid input voltage and current usage, solenoid actuator speed of operation, and/or leak detection. Other numbers and locations of sensors can be used without departing from the scope of the invention.

The use of the sensors 32 and the sensed parameters allow for the manufacturer to build a detailed picture both of the user's behavior and of the environmental factors that may impact their products operation and longevity. This allows new failure modes or usage trends to be identified using pattern recognition technology such a, but not limited to, Neural Nets or other machine learning/artificial intelligence techniques.

As an example, in various appliances, the solenoid valve 10 is one of the first components exposed to a water inlet. The condition of the water can impact the operation of the appliance or system in many ways. The solenoid valve of the present invention integrates electronic functionality within the solenoid valve to enable a smart relay that can interface directly with the controller module via a bidirectional communications bus or wireless link which enables additional advanced monitoring and control capability to be added to the solenoid valve.

With the emergence of networked appliances manufacturers have the ability to gather process data from home appliances. The use of solenoid valves with integrated control circuitry 30 and sensors 32 facilitates the ability to collect data to allow the manufacturers to provide value adding services such as preventative maintenance or appliance efficiency tracking and may also allow manufacturers to monitor when appliances are operated outside of warranty conditions. Data gathered may also highlight failure modes statistically which are not evident to the manufacturer today, allowing the manufacturer to improve their products over time.

While the invention has been described with reference to a preferred embodiment, it will be understood by those skilled in the art that various changes may be made and equivalents may be substituted for elements thereof without departing from the spirit and scope of the invention as defined in the accompanying claims. One skilled in the art will appreciate that the invention may be used with many modifications of structure, arrangement, proportions, sizes, materials and components and otherwise used in the practice of the invention, which are particularly adapted to specific environments and operative requirements without departing from the principles of the present invention. The presently disclosed embodiments are therefore to be considered in all respects as illustrative and not restrictive, the scope of the invention being defined by the appended claims, and not limited to the foregoing description or embodiments.

The invention claimed is:

1. A solenoid valve comprising:
   a solenoid body having a solenoid receiving cavity and a flow receiving passage;
   a solenoid assembly provided in the solenoid receiving cavity;
   a valve provided in the flow receiving passage;
   an armature extending from the solenoid assembly to the valve;
   a control circuitry provided in the solenoid receiving cavity;
   a power connection;
   a bidirectional communications connection;
   at least one sensor provided in the flow receiving passage, the at least one sensor is provided at an inflow side of the flow receiving passage, the at least one sensor being in communication with the control circuitry;
   wherein, when in operation, power is continuously supplied through the power connection and actuation of the valve is initiated by the bidirectional communications connection;
   wherein conductive points provided on the solenoid body allowing power and signal transmission to the at least one sensor without impacting the fluid retention effectiveness of the flow receiving passage of the solenoid body;
   wherein switching of the solenoid assembly is done locally to the valve.

2. The solenoid valve as recited in claim 1, wherein the control circuitry is a circuit board.

3. The solenoid valve as recited in claim 1, wherein the bidirectional communications connection is a low voltage communication bus.

4. The solenoid valve as recited in claim 1, wherein the bidirectional communications connection is a wireless connection.

5. The solenoid valve as recited in claim 1, wherein control messages are supplied to the solenoid through the power connection.

* * * * *

UNITED STATES PATENT AND TRADEMARK OFFICE
CERTIFICATE OF CORRECTION

| | | |
|---|---|---|
| PATENT NO. | : 11,767,927 B2 | Page 1 of 1 |
| APPLICATION NO. | : 17/369042 | |
| DATED | : September 26, 2023 | |
| INVENTOR(S) | : Robin Wesson et al. | |

It is certified that error appears in the above-identified patent and that said Letters Patent is hereby corrected as shown below:

On the Title Page

Item (72) Inventors
Second inventor currently shown as: Pai Rajendra, Shanghai (CN); should be Rajendra PAI Signed and Sealed this
Twenty-first Day of November, 2023

Katherine Kelly Vidal
*Director of the United States Patent and Trademark Office*